US012805383B2

(12) United States Patent
Hanaoka et al.

(10) Patent No.: US 12,805,383 B2
(45) Date of Patent: Nov. 17, 2026

(54) SEMICONDUCTOR SENSOR AND METHOD FOR MANUFACTURING SAME

(71) Applicant: Mitsubishi Electric Corporation, Tokyo (JP)

(72) Inventors: Misaki Hanaoka, Tokyo (JP); Hisatoshi Hata, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 497 days.

(21) Appl. No.: 18/279,066

(22) PCT Filed: Mar. 1, 2022

(86) PCT No.: PCT/JP2022/008619

§ 371 (c)(1),
(2) Date: Aug. 28, 2023

(87) PCT Pub. No.: WO2022/254838

PCT Pub. Date: Dec. 8, 2022

(65) Prior Publication Data

US 2024/0145324 A1 May 2, 2024

(30) Foreign Application Priority Data

Jun. 3, 2021 (JP) ................................. 2021-093637

(51) Int. Cl.
*H10W 76/48* (2026.01)
*H10F 39/10* (2025.01)

(52) U.S. Cl.
CPC .......... *H10W 76/48* (2026.01); *H10F 39/107* (2025.01)

(58) Field of Classification Search
CPC ........ H10W 76/48; B81B 3/00; B81B 7/0038; B81C 1/00; B81C 1/00285;
(Continued)

(56) References Cited

U.S. PATENT DOCUMENTS 9,957,154 B2 * 5/2018 Favier .................. B81B 7/0038
2002/0175284 A1 * 11/2002 Vilain .................. B81B 7/0038
257/E27.136

(Continued)

FOREIGN PATENT DOCUMENTS

JP 104-158583 A 6/1992
JP H09-506712 A 6/1997

(Continued)

OTHER PUBLICATIONS

Extended European Search Report issued Nov. 11, 2024 in European Patent Application No. 22815596.6, 7 pages.

(Continued)

*Primary Examiner* — Moazzam Hossain
(74) *Attorney, Agent, or Firm* — XSENSUS LLP

(57) ABSTRACT

Plural hollow structure bodies (3) are formed in a semiconductor substrate (1) in an array manner. The Plural hollow structure bodies (3) have a detection part (4) as a hollow structure and a getter part (5) as a hollow structure different from the detection part (4). A support body (6) demarcates the plural hollow structure bodies (3). The detection part (4) has a detection device (14) inside. The getter part (5) has a getter (16) inside. The detection part (4) and the getter part (5) are spatially joined together by a tunnel portion (7) formed in the support body (6).

19 Claims, 22 Drawing Sheets

(58) Field of Classification Search
CPC .... B81C 1/00317; B81C 1/00349; G01J 1/02; G01J 5/02; G01J 5/024; G01J 5/045; G01J 5/20; H10F 39/107; H10P 36/00; H10P 36/03; H10P 36/07; H10P 36/20
See application file for complete search history.

(56) References Cited

U.S. PATENT DOCUMENTS

| | | | | |
|---|---|---|---|---|
| 2007/0262428 | A1* | 11/2007 | Summers | B81B 7/0038 257/E23.137 |
| 2017/0328778 | A1* | 11/2017 | Kobayashi | G01J 5/024 |
| 2018/0335347 | A1 | 11/2018 | Herrmann et al. | |

FOREIGN PATENT DOCUMENTS

| | | | |
|---|---|---|---|
| JP | 2004-093535 | A | 3/2004 |
| JP | 2005-197151 | A | 7/2005 |
| JP | 2010-216819 | A | 9/2010 |
| JP | 2017-203737 | A | 11/2017 |
| JP | 2019-504298 | A | 2/2019 |
| WO | 95/17014 | A1 | 6/1995 |

OTHER PUBLICATIONS

International Search Report mailed on May 17, 2022, received for PCT Application PCT/JP2022/008619, filed on Mar. 1, 2022, 7 pages including English Translation.

Dumont et al., “Pixel level packaging for uncooled IRFPA”, Proceedings of SPIE, vol. 8012 80121I-1, May 2011, pp. 80121I-1-80121I-7.

Notice of Reasons for Refusal mailed on Aug. 23, 2022, received for JP Application 2022-538322, 11 pages Including English Translation.

Notice of Reasons for Refusal mailed on Jan. 10, 2023, received for JP Application 2022-538322, 9 pages Including English Translation.

Decision of Dismissal of Amendment mailed on May 23, 2023, received for JP Application 2022-538322, 7 pages Including English Translation.

Decision of Refusal mailed on May 23, 2023, received for JP Application 2022-538322, 2 pages including English Translation.

Office Action dated Jul. 3, 2026 in corresponding CN patent application No. 202280038315.8 (16 pages; with English translation).

* cited by examiner

SEMICONDUCTOR SENSOR AND METHOD FOR MANUFACTURING SAME

CROSS-REFERENCE TO RELATED APPLICATIONS

The present application is based on PCT filing PCT/JP2022/008619, filed Mar. 1, 2022, which claims priority from Japanese Patent Application No. 2021-093637, filed Jun. 3, 2021, the entire contents of each are incorporated herein by reference.

FIELD

The present disclosure relates to a semiconductor sensor having hollow structure bodies and a method for manufacturing same.

BACKGROUND

Vacuum sealing is necessary for a semiconductor sensor having a hollow structure. In order to maintain a vacuum degree inside the vacuum sealing, a getter as an adsorbent of residual gas is built therein. For reducing costs for a sensor, a pixel-level vacuum sealing technique has been employed in recent years. Formation of getter on a lower portion or on a wall surface of a hollow structure can be achieved using a MEMS (microelectromechanical systems) technique by forming a surface with a sacrificial layer on a structure with a getter applied thereon and forming a thin film as a hollow structure (see Patent Literature 1, for example).

CITATION LIST

Patent Literature

[PTL 1] U.S. Patent Application Publication No. 2002/0175284

SUMMARY

Technical Problem

In recent years, cost reduction has been progressing by size reduction of pixels, and thus, in employment of a pixel-level vacuum sealing technique, an area of a getter which can be applied to an inside of the pixel has been decreased. Consequently, there has been a problem that maintenance performance of a vacuum degree of a hollow structure is lowered.

Further, there may be a case where it is difficult to employ the pixel-level vacuum scaling technique depending on a formation process of a pixel. For example, because in a case where the hollow structure is formed by etching a semiconductor, the getter cannot be applied to a lower portion of the hollow structure, the pixel-level vacuum sealing technique has not been employable. Further, it has been desired that a pixel array region be reduced while a sufficient getter area is secured for retaining a proper vacuum degree.

The present disclosure has been made for solving the above-described problems, and an object thereof is to obtain a semiconductor sensor and a method for manufacturing same which can prevent lowering of maintenance performance of a vacuum degree due to size reduction of a pixel without decreasing an area of a getter.

Further, another object thereof is to obtain a semiconductor sensor and a method for manufacturing same which can reduce a pixel array region while securing a sufficient getter area for retaining a proper vacuum degree.

Solution to Problem

A semiconductor device according to the present disclosure includes: a semiconductor substrate; plural hollow structure bodies formed in the semiconductor substrate in an array manner and having a detection part as a hollow structure and a getter part as a hollow structure different from the detection part; and a support body demarcating the plural hollow structure bodies, wherein the detection part has a detection device inside, the getter part has a getter inside, and the detection part and the getter part are spatially joined together by a tunnel portion formed in the support body.

Furthermore, another semiconductor device according to the present disclosure includes: a semiconductor substrate; plural hollow structure bodies formed in the semiconductor substrate in an array manner and having a detection part as a hollow structure; and a support body demarcating the plural hollow structure bodies, wherein the detection part has a detection device inside, and a surface of the support body is covered by a getter.

A method for manufacturing a semiconductor device according to the present disclosure includes: forming an oxide film on a main surface of the semiconductor substrate and forming the detection device on the oxide film; forming a groove in the main surface of the semiconductor substrate by etching; filling the groove with an oxide to form the support body; forming the wiring on the support body; forming the support leg on the main surface of the semiconductor substrate; forming a sacrificial layer on the main surface of the semiconductor substrate so as to cover the detection device, the wiring, and the support leg; removing the sacrificial layer on the wiring to form an opening; forming the sealing material support body in an internal portion of the opening and on the sacrificial layer; forming an etching hole passing through the sealing material support body and the sacrificial layer; selectively etching the semiconductor substrate via the etching hole to form the hollow structure body and the tunnel portion; after forming the hollow structure body and the tunnel portion, removing the sacrificial layer; and after removing the sacrificial layer, depositing the sealing material on the sealing material support body under a vacuum condition and blocking the etching hole to seal the hollow structure body in a vacuum state.

Another method for manufacturing a semiconductor device according to the present disclosure includes: forming a groove in a main surface of the semiconductor substrate by etching; forming the getter on an inner wall of the groove and filling the groove with the oxide to form the support body; and selectively etching the semiconductor substrate with respect to the getter to form the hollow structure body.

Advantageous Effects of Invention

In the semiconductor device according to the present disclosure, lowering of maintenance performance of the vacuum degree due to size reduction of the pixel can be prevented without decreasing an area of the getter. Further, even in a case where the hollow structure body is formed by etching of a semiconductor, pixel-level vacuum sealing can be employed.

Furthermore, in another semiconductor device according to the present disclosure, because the getter is provided on the surface of the support body, a sufficient getter area for retaining a proper vacuum degree can be secured. Further, because the getter part is not necessary, a pixel array region can be reduced.

DESCRIPTION OF EMBODIMENTS

A semiconductor sensor and a method for manufacturing same according to the embodiments of the present disclosure will be described with reference to the drawings. The same components will be denoted by the same symbols, and the repeated description thereof may be omitted.

First Embodiment

Figure 1:
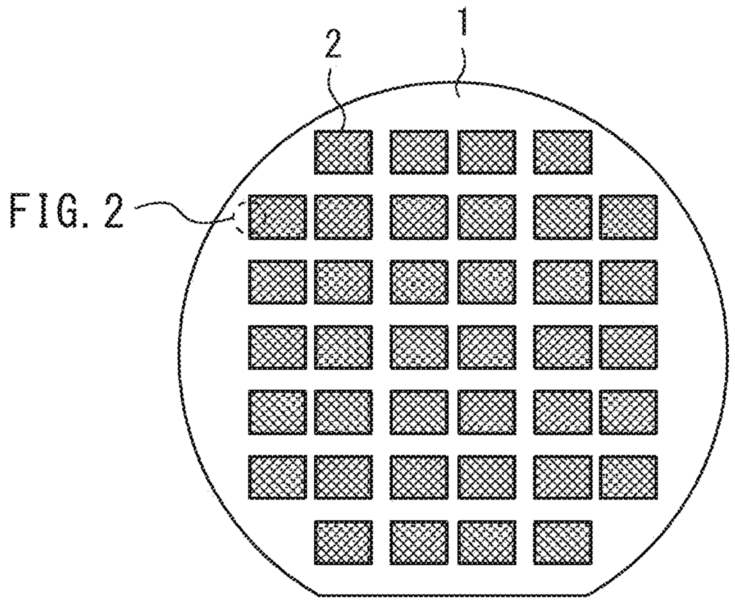
FIG. 1 is a plan view illustrating a wafer used for manufacturing of a semiconductor sensor according to a first embodiment.

FIG. 1 is a plan view illustrating a wafer used for manufacturing of a semiconductor sensor according to a first embodiment. A semiconductor substrate 1 is a wafer-shaped Si substrate or SOI (silicon-on-insulator) substrate. Plural semiconductor sensors 2 are formed on the semiconductor substrate 1.

Figure 2:
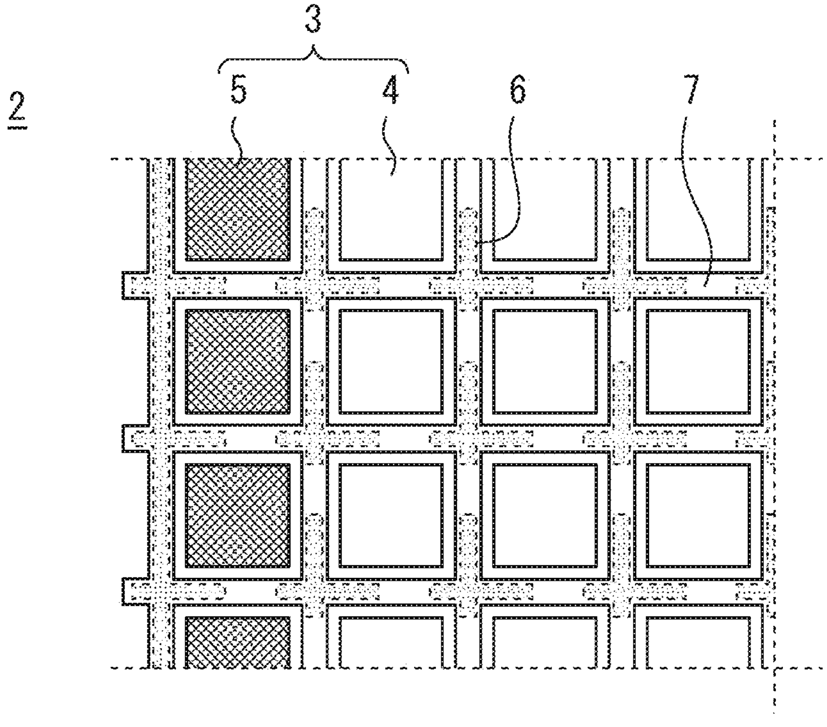
FIG. 2 is a plan view in which a part of the semiconductor sensor in FIG. 1 is enlarged.

FIG. 2 is a plan view in which a part of the semiconductor sensor in FIG. 1 is enlarged. Plural hollow structure bodies 3 are formed in the semiconductor substrate 1 in an array manner. Each of the plural hollow structure bodies 3 has a detection part 4 as a hollow structure and a getter part 5 as a hollow structure different from the detection part 4. A support body 6 demarcates the plural hollow structure bodies 3. The getter part 5 is arranged in a position in which that does not hinder image detection or space information detection by the detection part 4 and is arranged at an end of the sensor herein. Note that the getter parts 5 may be arranged throughout plural columns at the end of the sensor. The detection part 4 and the getter part 5, and the detection parts 4 adjacent with each other are spatially joined together by respective tunnel portions 7 formed in the support body 6 and share a vacuum space. The tunnel portion 7 is a portion obtained by cavitating a part of the support body 6.

Figure 3:
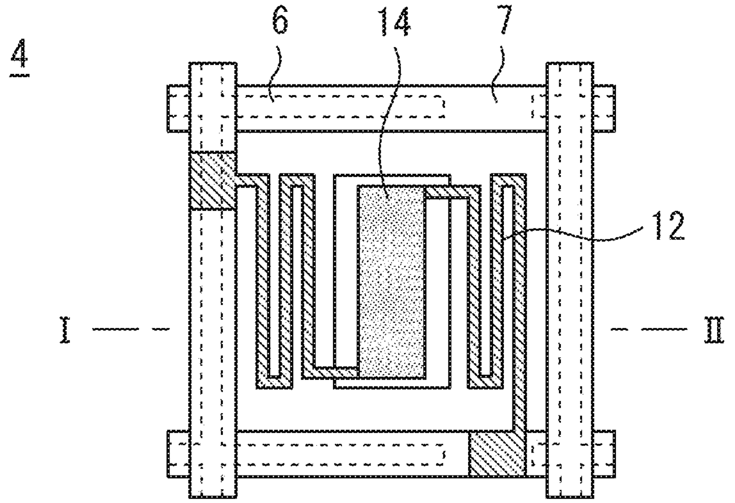
FIG. 3 is a plan view illustrating the detection part of the semiconductor sensor according to the first embodiment.
Figure 4:
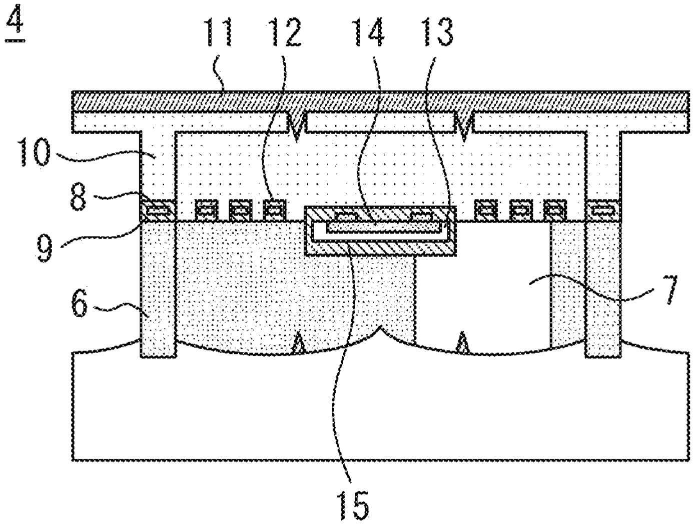
FIG. 4 is a diagram in which a cross section taken along line I-II in FIG. 3 is seen from a lateral position.

FIG. 3 is a plan view illustrating the detection part of the semiconductor sensor according to the first embodiment. FIG. 4 is a diagram in which a cross section taken along line I-II in FIG. 3 is seen from a lateral position. The support body 6, the tunnel portion 7, and a sealing material support body 10, which are present on deeper sides, can be seen in a see-through manner.

Wiring 8 is formed on the support body 6. The wiring 8 extends in a longitudinal direction and a lateral direction between the hollow structure bodies 3 for driving the sensor and for obtaining a signal and is connected with a scanning circuit formed with a switch, for example. An insulating layer 9 protects the wiring 8. The sealing material support body 10 is laminated on the support body 6 and covers the hollow structure body 3. A sealing material 11 is provided on the sealing material support body 10 and seals the plural hollow structure bodies 3 in a vacuum state.

In the hollow structure body 3 surrounded by the support body 6, a support leg 12 extends from the support body 6 and retains a hollow substrate 13 to be hollow. Material and shape of the support leg 12 are selected in accordance with a purpose of use of the sensor. In a case where the support leg 12 is formed as thermal insulation wiring, it is preferable that Ti or the like be used as a material with a small thermal conductance and the support leg 12 be designed to be as thin and long as possible. In order to avoid deformation of or a current leakage from the support leg 12, a surface of the support leg 12 may be covered by an insulating film formed of $SiO_2$ or the like. In a case where the support leg 12 is formed as the thermal insulation wiring, it is preferable that that be designed to be as thin and long as possible.

A detection device 14 is formed in the hollow substrate 13 in an internal portion of the detection part 4. The detection part 4 and the support leg 12 are retained to be hollow and are spaced away from the sealing material support body 10 and the semiconductor substrate 1. The detection device 14 is, as an infrared sensor, a thermal infrared detection device such as a PN junction diode, a resistance bolometer, or a thermopile, for example. In this case, the semiconductor sensor is an infrared sensor. The support leg 12 electrically connects the wiring 8 with the detection device 14. At least a lower surface of the hollow substrate 13 is covered by an oxide film 15. In addition, the detection device 14 may be used as a sensor accompanying the hollow structure such as a gas monitor, a pressure sensor, a vacuum gauge, or an acceleration sensor, but a configuration of the detection device 14 is different in accordance with the purpose of use.

Figure 5:
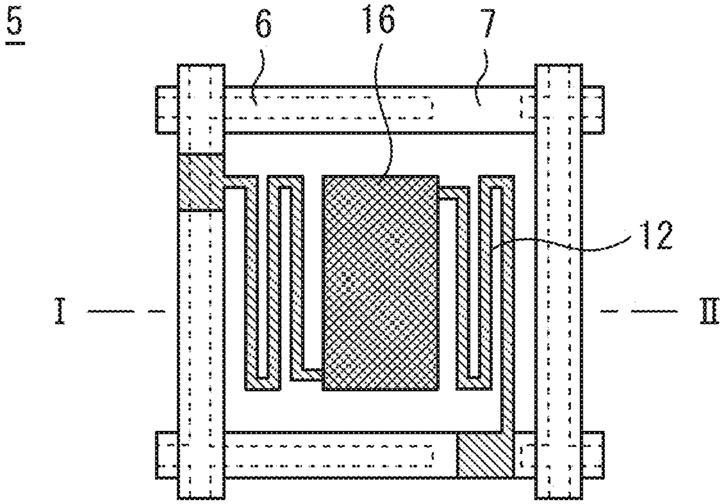
FIG. 5 is a plan view illustrating the getter part of the semiconductor sensor according to the first embodiment.
Figure 6:
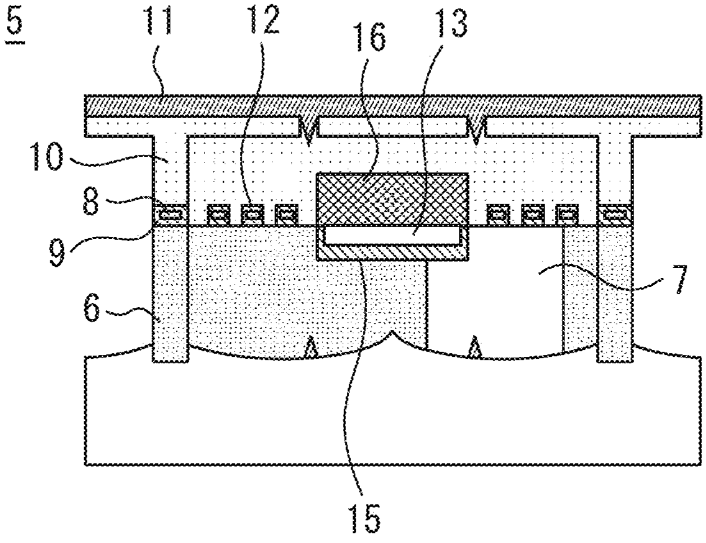
FIG. 6 is a diagram in which a cross section taken along line I-II in FIG. 5 is seen from a lateral position.

FIG. 5 is a plan view illustrating the getter part of the semiconductor sensor according to the first embodiment. FIG. 6 is a diagram in which a cross section taken along line I-II in FIG. 5 is seen from a lateral position. In an internal portion of the getter part 5, the getter 16 is applied onto the hollow substrate 13 which is retained to be hollow by the support leg 12. The getter 16 and the support leg 12 are retained to be hollow and are spaced away from the sealing material support body 10 and the semiconductor substrate 1. The getter 16 serves as an adsorbent of residual gas and is formed with a metal thin film of metal such as Ti, for example. Other structures are similar to those of the detection part 4 illustrated in FIG. 4. Note that in a case of no utilization as wiring, the wiring 8 is not necessary for the getter part 5.

Next, a description will be made about methods for manufacturing the detection part 4 and the getter part 5 of the semiconductor sensor according to the present embodiment. FIG. 7 to FIG. 24 are cross-sectional views illustrating a method for manufacturing the semiconductor sensor according to the first embodiment. Those drawings correspond to cross-sectional views taken along line I-II in FIG. 3 or FIG. 5.

Figure 7:
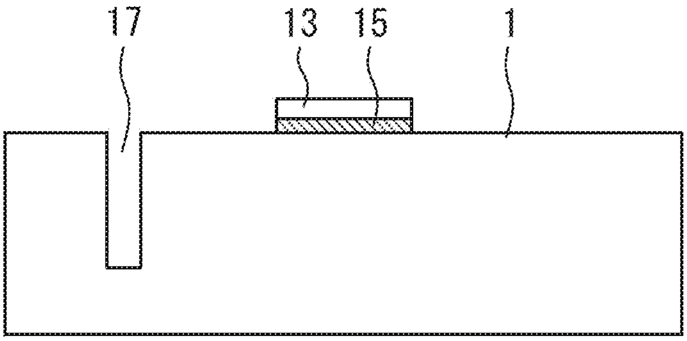
FIG. 7 is a cross-sectional view illustrating a method for manufacturing the semiconductor sensor according to the first embodiment.

First, as illustrated in FIG. 7, the oxide film 15 is formed on a main surface of the semiconductor substrate 1, and the hollow substrate 13 is formed on the oxide film 15. A groove 17 is formed in the main surface of the semiconductor substrate 1 by etching. The hollow substrate 13 is formed by forming a film on the semiconductor substrate 1 or by etching a periphery of the hollow substrate 13. The groove 17 is formed in a position in which the support body 6 is subsequently formed. The groove 17 is not formed in a position in which the tunnel portion 7 is formed. It is desirable that a depth of the groove 17 be set to a length equivalent to or greater than half a length of one side of the hollow structure.

Figure 8:
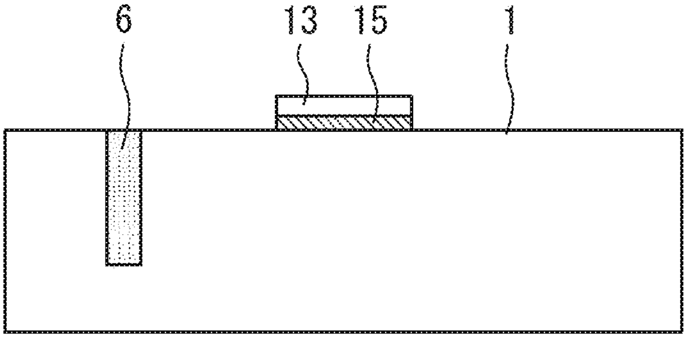
FIG. 8 is a cross-sectional view illustrating a method for manufacturing the semiconductor sensor according to the first embodiment.
Figure 9:
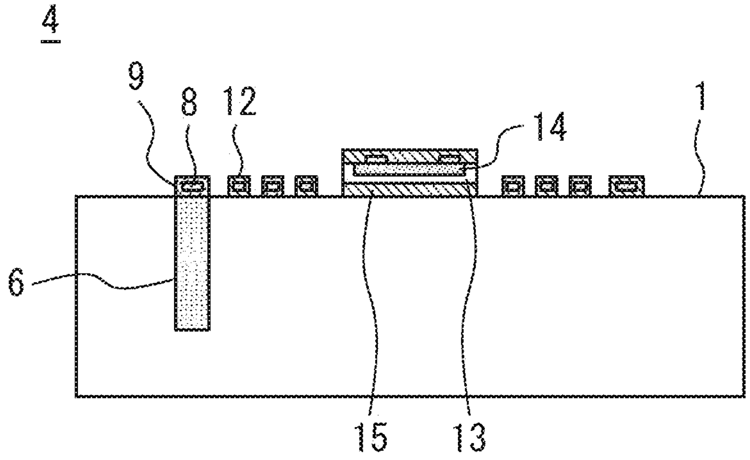
FIG. 9 is a cross-sectional view illustrating a method for manufacturing the semiconductor sensor according to the first embodiment.

Next, as illustrated in FIG. 8, the groove 17 is filled with an oxide, and the support body 6 is thereby formed. Next, as illustrated in FIG. 9, in the detection part 4, the detection device 14 is formed in the hollow substrate 13. The detection device 14 is selected in accordance with the purpose of use of the sensor. In a case where the detection device 14 is used as a diode or a resistor, the detection device 14 is formed by ion implantation or the like, and an electric contact is formed with metal wiring of metal such as AI.

Figure 10:
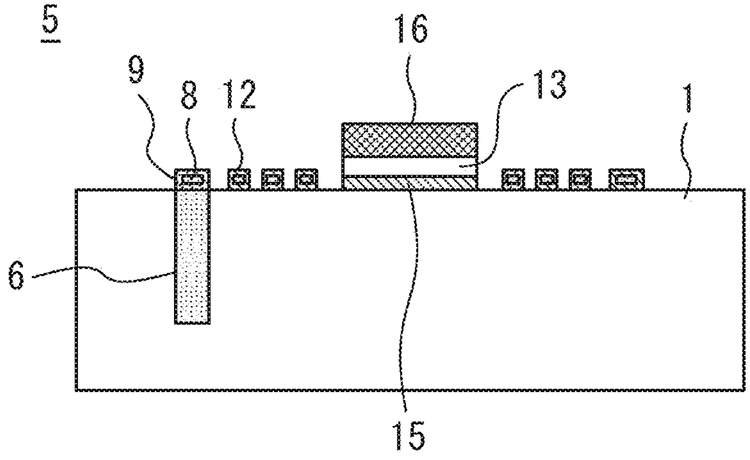
FIG. 10 is a cross-sectional view illustrating a method for manufacturing the semiconductor sensor according to the first embodiment.

The wiring 8 is formed on the support body 6. The support leg 12 is formed so as to join the wiring 8 to the detection device 14 on the main surface of the semiconductor substrate 1. Further, as illustrated in FIG. 10, the support leg 12 and the wiring 8 are formed in the getter part 5, and the getter 16 is thereafter applied to the hollow substrate 13. Note that in a case of no utilization as wiring, the wiring 8 is not necessary for the getter part 5.

Figure 11:
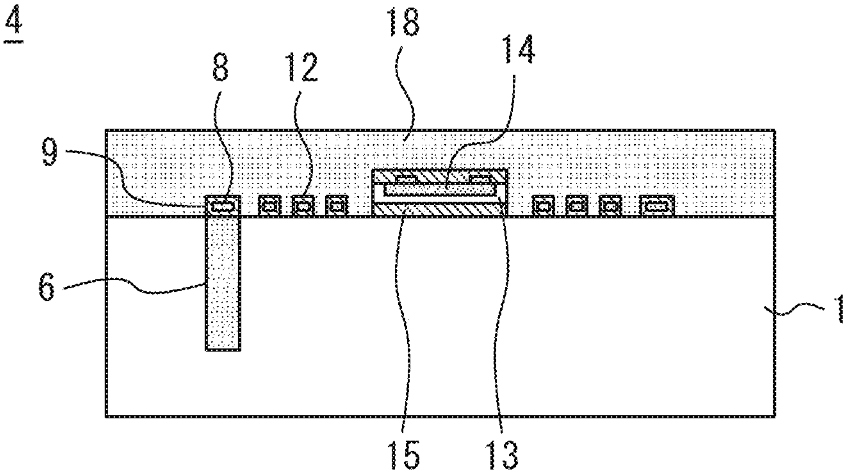
FIG. 11 is a cross-sectional view illustrating a method for manufacturing the semiconductor sensor according to the first embodiment.
Figure 12:
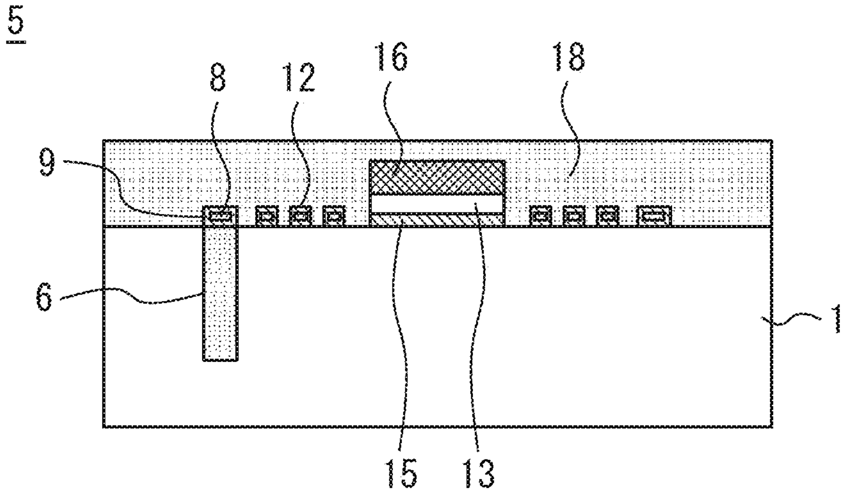
FIG. 12 is a cross-sectional view illustrating a method for manufacturing the semiconductor sensor according to the first embodiment.

Next, as illustrated in FIG. 11, on the main surface of the semiconductor substrate 1, a sacrificial layer 18 is formed so as to cover the detection device 14, the wiring 8, and the support leg 12. A material of the sacrificial layer 18 is a material in which pattern formation is possible by a photomechanical technique and is an organic material having photosensitivity such as a photoresist, for example. As illustrated in FIG. 12, a similar process is performed for the getter part 5. A process for the detection part 4 which is illustrated in FIG. 11 and a process for the getter part 5 which is illustrated in FIG. 12 are performed at the same time. Note that in the following descriptions, the corresponding processes for the detection part 4 and for the getter part 5 are performed at the same time.

Figure 13:
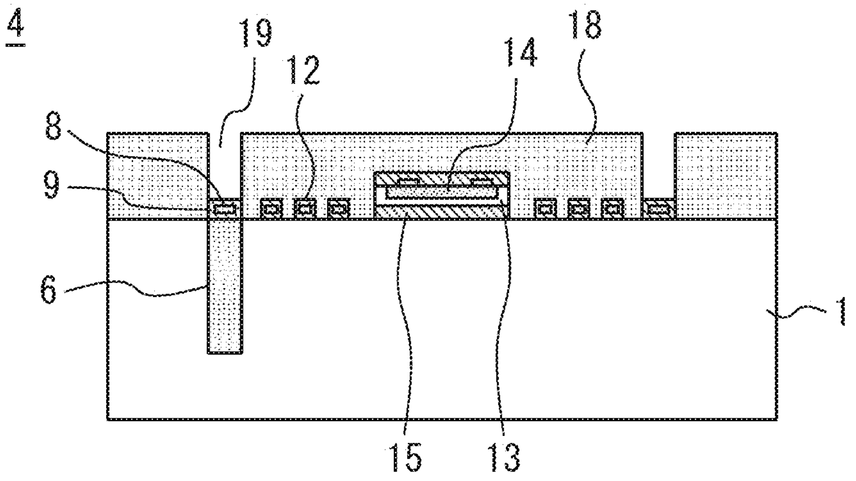
FIG. 13 is a cross-sectional view illustrating a method for manufacturing the semiconductor sensor according to the first embodiment.
Figure 14:
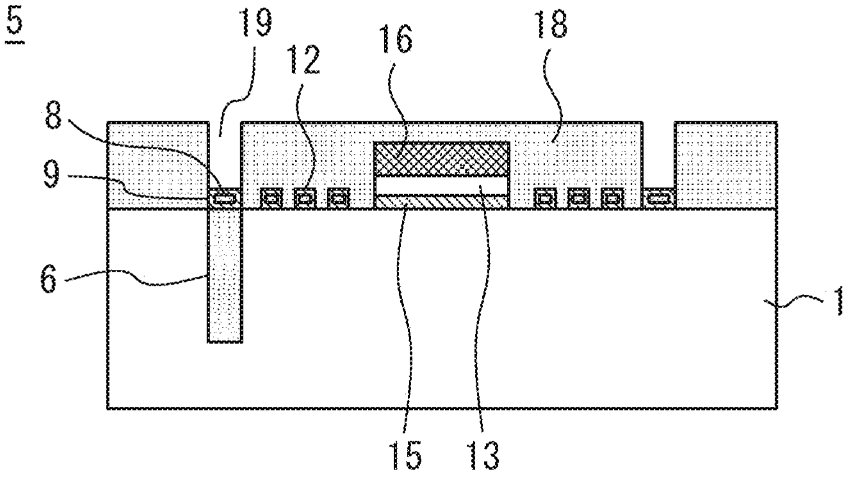
FIG. 14 is a cross-sectional view illustrating a method for manufacturing the semiconductor sensor according to the first embodiment.

Next, as illustrated in FIG. 13, an opening 19 is formed by removing the sacrificial layer 18 on the wiring 8. In a case where a material of the sacrificial layer 18 is a photoresist, only the sacrificial layer 18 on the wiring 8 is removed by the photomechanical technique. As illustrated in FIG. 14, a similar process is performed for the getter part 5.

Figure 15:
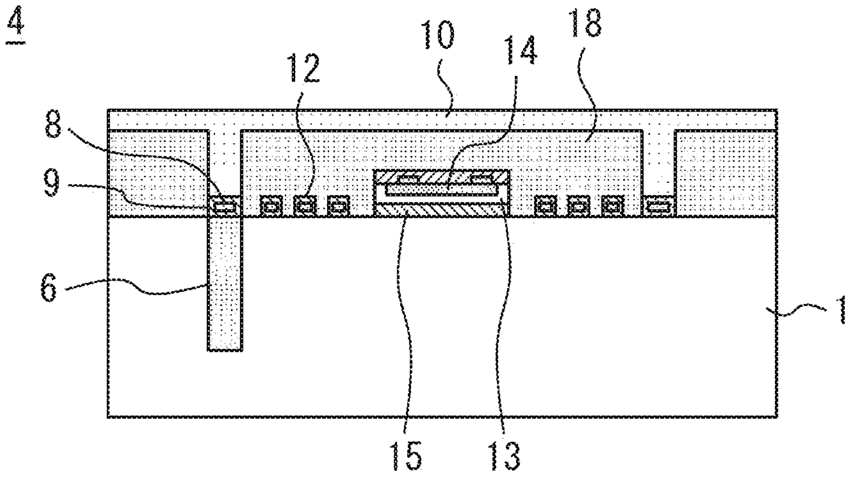
FIG. 15 is a cross-sectional view illustrating a method for manufacturing the semiconductor sensor according to the first embodiment.
Figure 16:
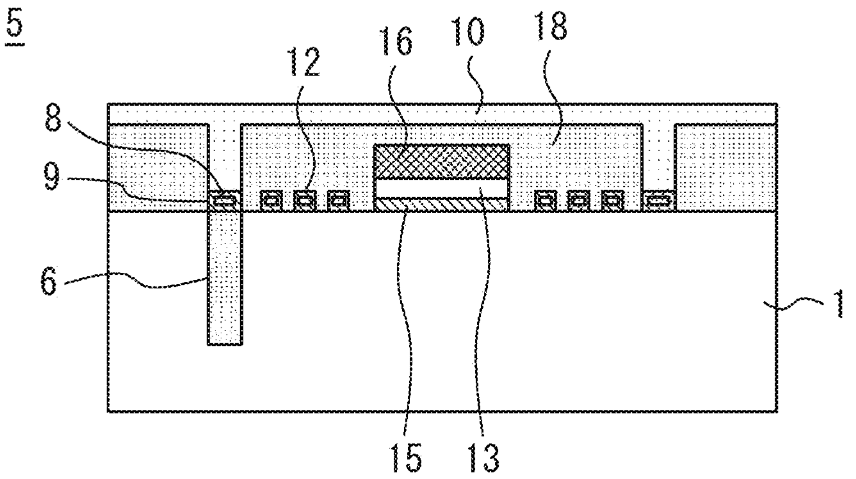
FIG. 16 is a cross-sectional view illustrating a method for manufacturing the semiconductor sensor according to the first embodiment.

Next, as illustrated in FIG. 15, the scaling material support body 10 is formed by depositing an oxide, for example, in an internal portion of the opening 19 and on the sacrificial layer 18. As illustrated in FIG. 16, a similar process is performed for the getter part 5.

Figure 17:
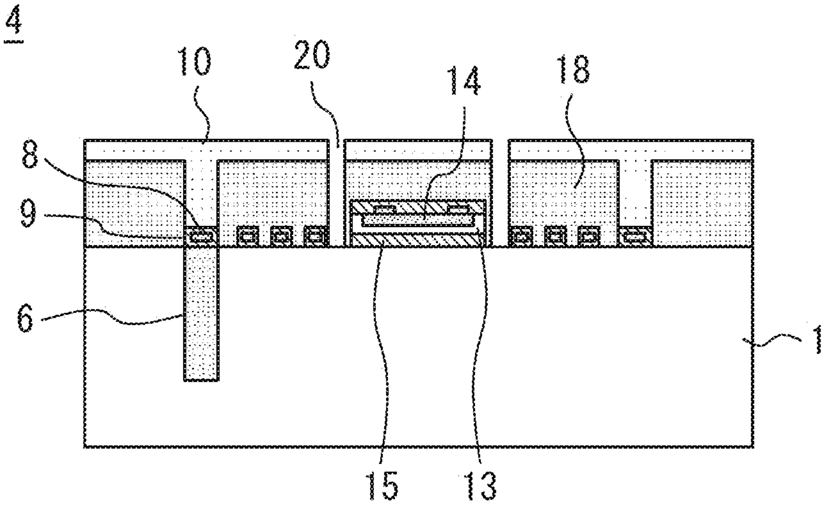
FIG. 17 is a cross-sectional view illustrating a method for manufacturing the semiconductor sensor according to the first embodiment.
Figure 18:
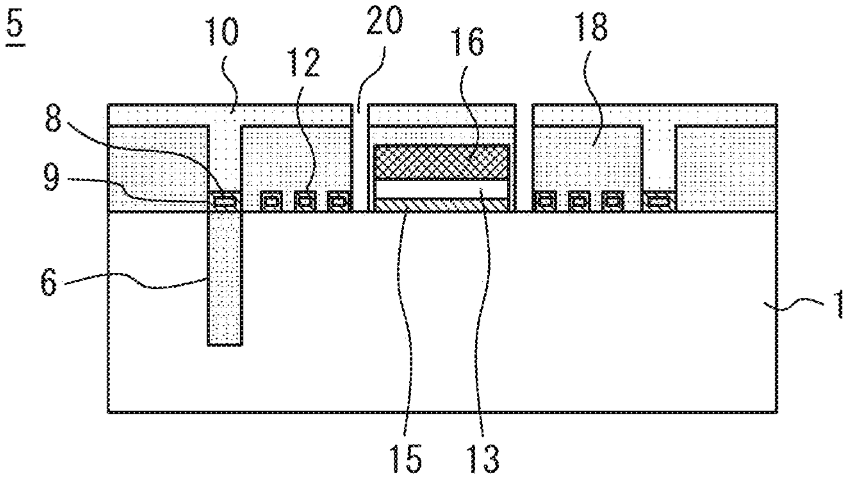
FIG. 18 is a cross-sectional view illustrating a method for manufacturing the semiconductor sensor according to the first embodiment.

Next, as illustrated in FIG. 17, etching holes 20 are formed which pass through the sealing material support body 10 and the sacrificial layer 18 while avoiding the detection device 14 and the support leg 12. A part of the main surface of the semiconductor substrate 1 is exposed via the etching holes 20. As illustrated in FIG. 18, a similar process is performed for the getter part 5.

Figure 19:
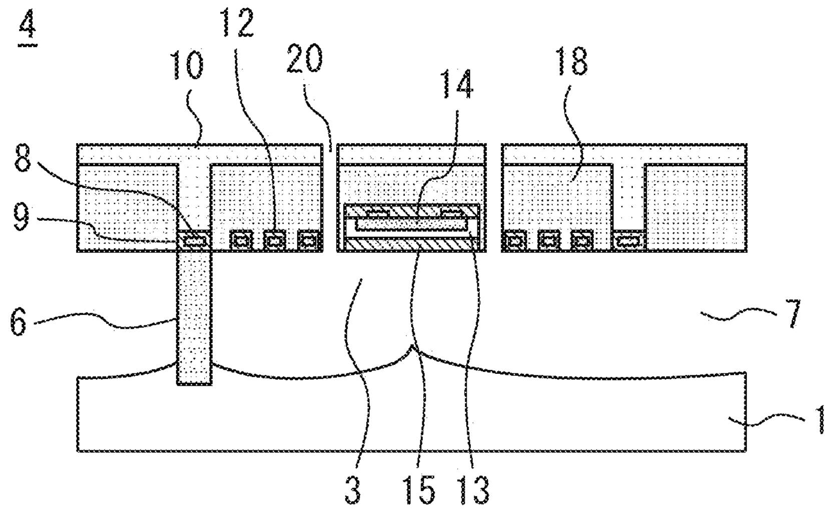
FIG. 19 is a cross-sectional view illustrating a method for manufacturing the semiconductor sensor according to the first embodiment.
Figure 20:
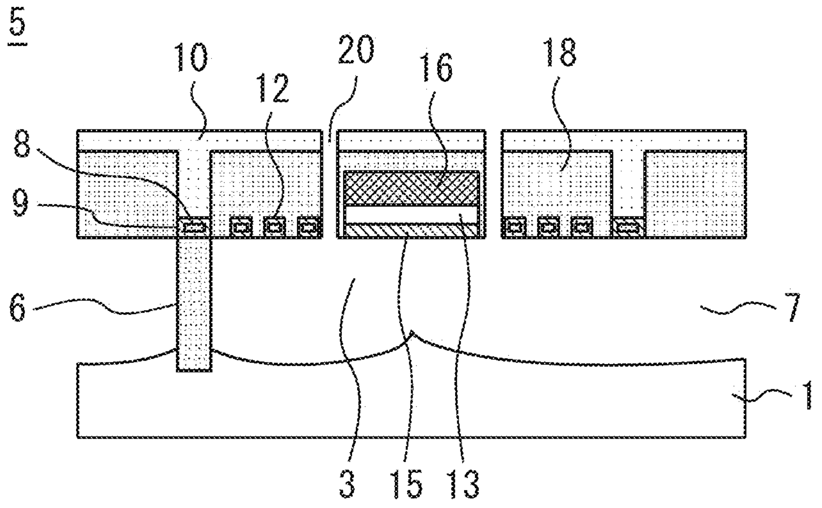
FIG. 20 is a cross-sectional view illustrating a method for manufacturing the semiconductor sensor according to the first embodiment.

Next, as illustrated in FIG. 19, the hollow structure body 3 and the tunnel portion 7 are formed by selectively etching the semiconductor substrate 1 via the etching holes 20. As an etching method, a dry etching by xenon fluoride is used, for example. In this case, the support body 6, the sealing material support body 10, and the oxide film 15 are not etched because of the oxide, but only the semiconductor substrate 1 as a semiconductor such as Si is isotropically etched. The hollow substrate 13 and the detection device 14 are covered by the oxide film 15 and the sacrificial layer 18 and are thus not etched. The tunnel portion 7 is formed in a portion immediately below the wiring 8, in which the support body 6 is not formed. In a planar view, as illustrated in FIG. 2, except the tunnel portion 7, the support bodies 6 are not etched but remain below the wiring 8. As illustrated in FIG. 20, a similar process is performed for the getter part 5.

Figure 21:
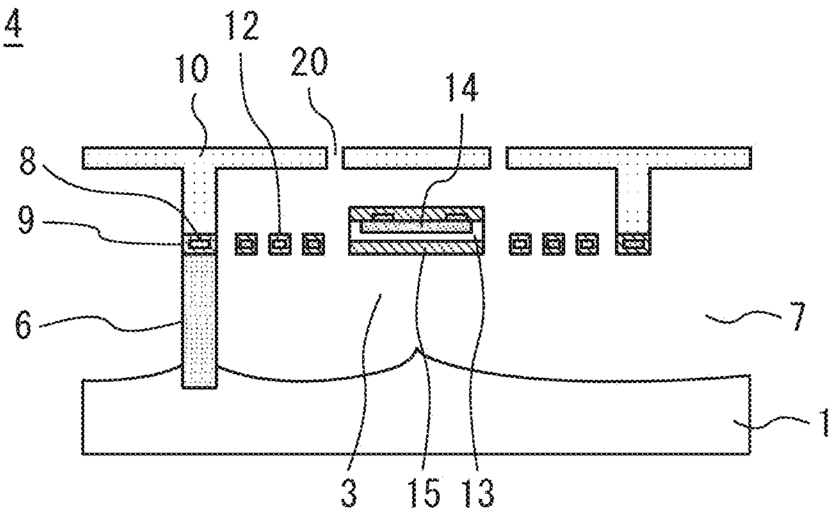
FIG. 21 is a cross-sectional view illustrating a method for manufacturing the semiconductor sensor according to the first embodiment.
Figure 22:
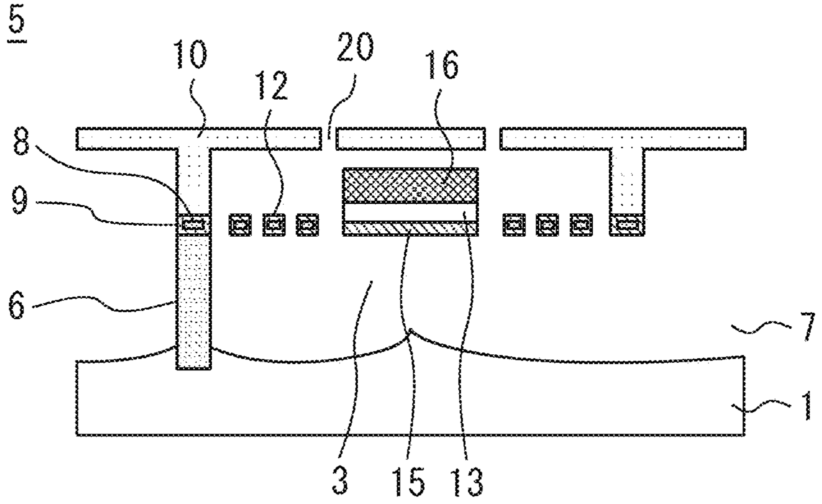
FIG. 22 is a cross-sectional view illustrating a method for manufacturing the semiconductor sensor according to the first embodiment.

Next, as illustrated in FIG. 21, the whole sacrificial layer 18 is removed, and the support leg 12 and the detection device 14 are set to a hollow state. As illustrated in FIG. 22, a similar process is performed for the getter part 5.

Figure 23:
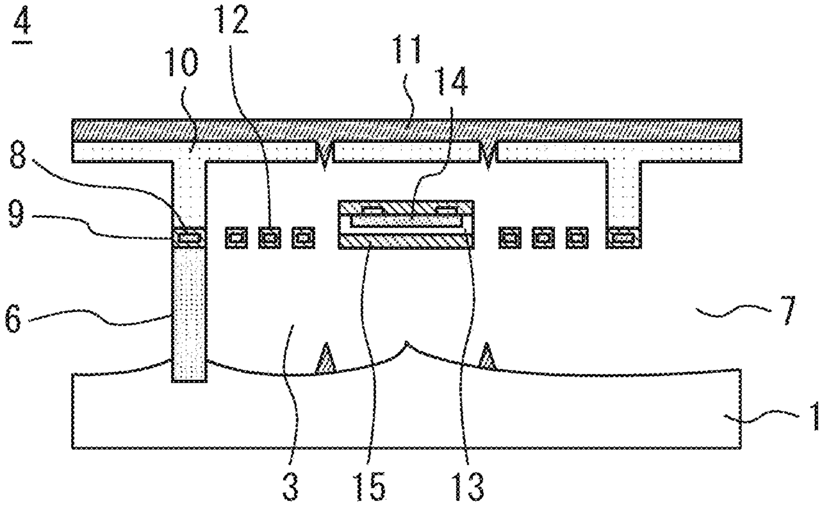
FIG. 23 is a cross-sectional view illustrating a method for manufacturing the semiconductor sensor according to the first embodiment.
Figure 24:
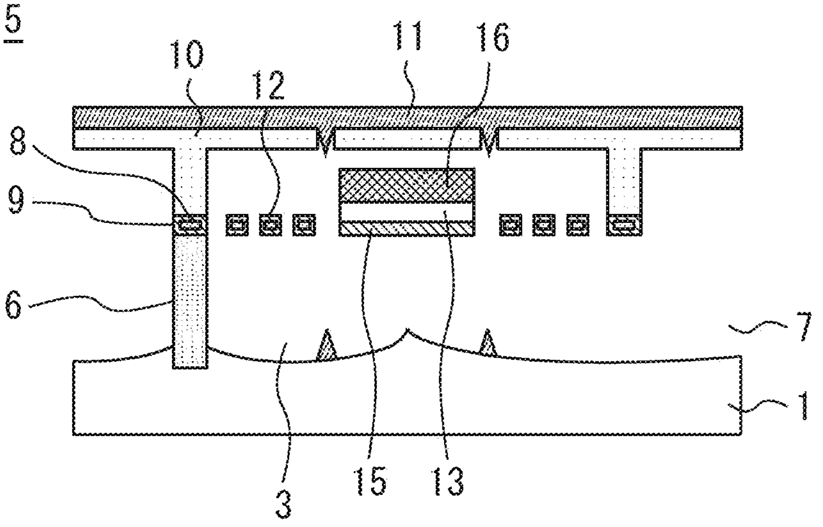
FIG. 24 is a cross-sectional view illustrating a method for manufacturing the semiconductor sensor according to the first embodiment.

Next, as illustrated in FIG. 23, the etching holes 20 are blocked by depositing the sealing material 11 on the sealing material support body 10 under a vacuum condition, and the hollow structure body 3 is thereby sealed in a vacuum state. A material of the sealing material 11 is selected in accordance with the purpose of use of the sensor, but a material is desirable which can block the etching holes 20 under the vacuum condition and retain the vacuum state of the hollow structure body 3. In a case of an optical sensor such as an infrared sensor, a semiconductor such as ZnS or Si is selected as the material of the sealing material 11 taking into consideration transmittance characteristics and so forth. As illustrated in FIG. 24, a similar process is performed for the getter part 5.

In the above processes, the detection part 4 and the getter part 5 of the semiconductor sensor according to the present embodiment can be manufactured.

As described above, in the present embodiment, the getter 16 is formed in the internal portion of the getter part 5 as the hollow structure body 3 which is different from the detection part 4. Because the detection part 4 and the getter part 5 are joined together by the tunnel portion 7, a vacuum degree of the detection part can be retained. Consequently, because the getter 16 does not have to be formed in the same pixel as the detection part 4, lowering of maintenance performance of the vacuum degree due to size reduction of the pixel can be prevented without decreasing an area of the getter 16. Further, even in a case where the hollow structure body 3 is formed by etching of a semiconductor, pixel-level vacuum sealing can be employed.

Further, in the getter part 5, the getter 16 is applied onto the hollow substrate 13 which is retained to be hollow by the support leg 12. Accordingly, a sufficient space can be provided to the tunnel portion 7. Further, a thickness of the hollow substrate 13 is adjusted, and a thickness of the getter 16 can thereby also be adjusted.

The tunnel portion 7 is formed in a part of one side of the hollow structure body 3 in a planar view and is arranged to be spaced away from a corner of the hollow structure body 3. Accordingly, high strength of the wiring 8 formed on the support body 6 and of the hollow structure body 3 can be retained. Because the support bodies 6 retaining holding strength are present in four corners of the hollow structure body 3, the tunnel portions 7 may be formed in four sides of the hollow structure body 3.

Second Embodiment

Figure 25:
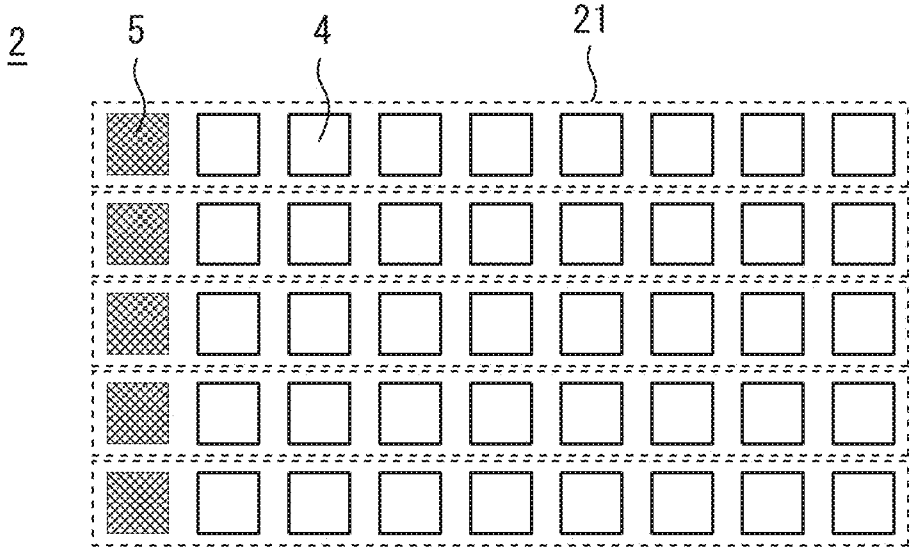
FIG. 25 is a plan view illustrating a semiconductor sensor according to a second embodiment.

FIG. 25 is a plan view illustrating a semiconductor sensor according to a second embodiment. Plural hollow structure bodies 3 are separated into plural hollow structure groups 21 which are not spatially joined with each other. Each of the hollow structure groups 21 has at least one detection part 4 and one getter part 5.

In each of the hollow structure groups 21, the detection part 4 and the getter part 5 are spatially joined together via the tunnel portion 7. In the sensor, the hollow structure groups 21 are present for the numbers of columns or rows of the hollow structure bodies 3. The getter part 5 is arranged in a position, in which that does not hinder the image detection by the detection part 4 or the space information to be obtained, such as an edge of the sensor, for example. Plural getter parts 5 may be included in the hollow structure group 21, and for example, plural columns of the getter parts 5 are arranged at both ends or an end of the column, for example. Note that one hollow structure group 21 may be configured with plural columns. That is, the detection part 4 and the getter part 5 are spatially joined together via the tunnel portion 7 in at least one column.

Even when vacuum sealing of a part of the hollow structure groups 21 is broken, functions of the sensor can be retained by the hollow structure groups 21 whose vacuum sealing is not broken. Further, because the same vacuum degree is retained in the column, it is easy to correct differences in detection performance due to differences in the vacuum degree.

Third Embodiment

Figure 26:
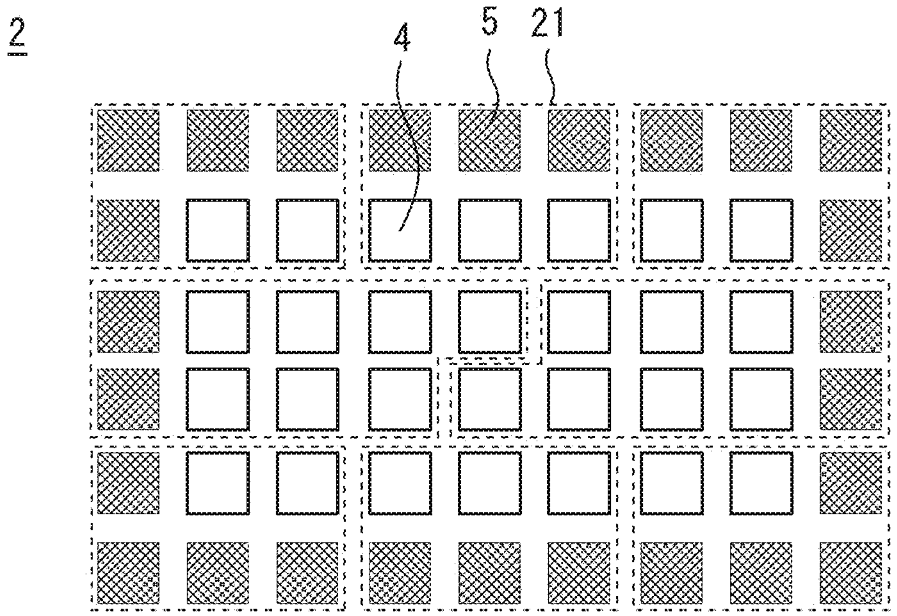
FIG. 26 is a plan view illustrating a semiconductor sensor according to a third embodiment.

FIG. 26 is a plan view illustrating a semiconductor sensor according to a third embodiment. In each of the hollow structure groups 21, the detection part 4 and the getter part 5 are spatially joined together via the tunnel portion 7 in each section which is formed with two or more rows and two or more columns. The hollow structure group 21 has at least one detection part 4 and one getter part 5. The hollow structure group 21 may have plural getter parts 5. For example, plural columns of the getter parts 5 are arranged on four sides at edges of the sensor or at an edge of the sensor, for example.

Similarly to the second embodiment, even when the vacuum sealing of a part of the hollow structure groups 21 is broken, the functions of the sensor can be retained by the hollow structure groups 21 whose vacuum sealing is not broken. Further, because the getter parts 5 can be arranged on the four sides at the edges of the sensor, the number of getter parts 5 included in one hollow structure group 21 can be increased.

Fourth Embodiment

Figure 27:
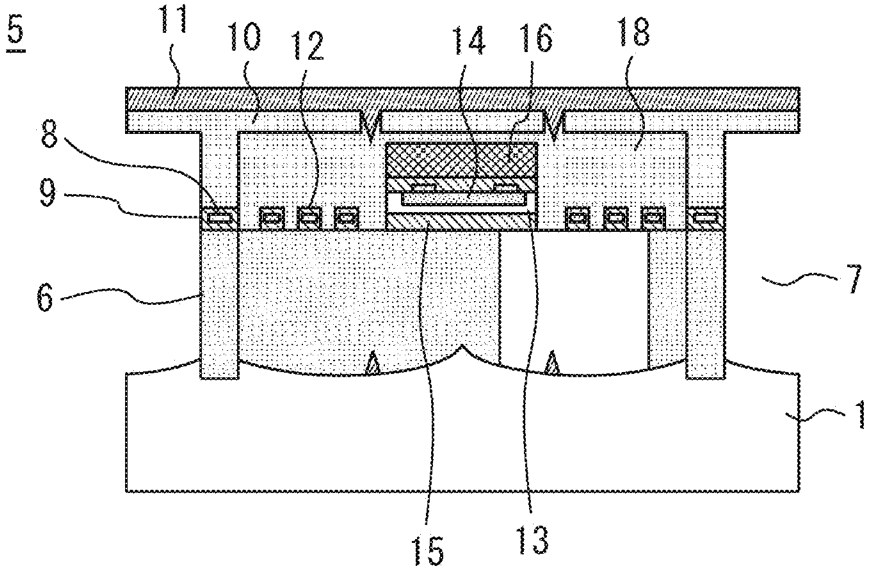
FIG. 27 is a cross-sectional view illustrating a getter part of a semiconductor sensor according to a fourth embodiment.

FIG. 27 is a cross-sectional view illustrating a getter part of a semiconductor sensor according to a fourth embodiment. In the present embodiment, not only in the detection part 4 but also in the getter part 5, the detection device 14 is formed in the hollow substrate 13 which is retained to be hollow by the support leg 12. In the getter part 5, the getter 16 is applied onto the hollow substrate 13 in which the detection device 14 is formed.

The getter 16 is formed of metal such as Ti, which is formed into a thin film, for example, and the metal reflects light such as visible light and infrared rays. For example, the metal having a somewhat thick film thickness is applied to the hollow substrate 13 in order to enhance reflectance, and incidence of light on the detection device 14 of the getter part 5 can thereby be prevented. In a case where the detection device 14 serves as an infrared sensor, the detection device 14 covered by the getter 16 cannot detect infrared rays. Thus, the getter part 5 can be utilized as a reference pixel for obtaining a signal of the detection device 14 which is not receiving infrared rays. However, it is not necessary to use all of the getter parts 5 as the reference pixels, but the getter parts 5 other than a necessary number of those may have the configuration of the first embodiment.

Fifth Embodiment

Figure 28:
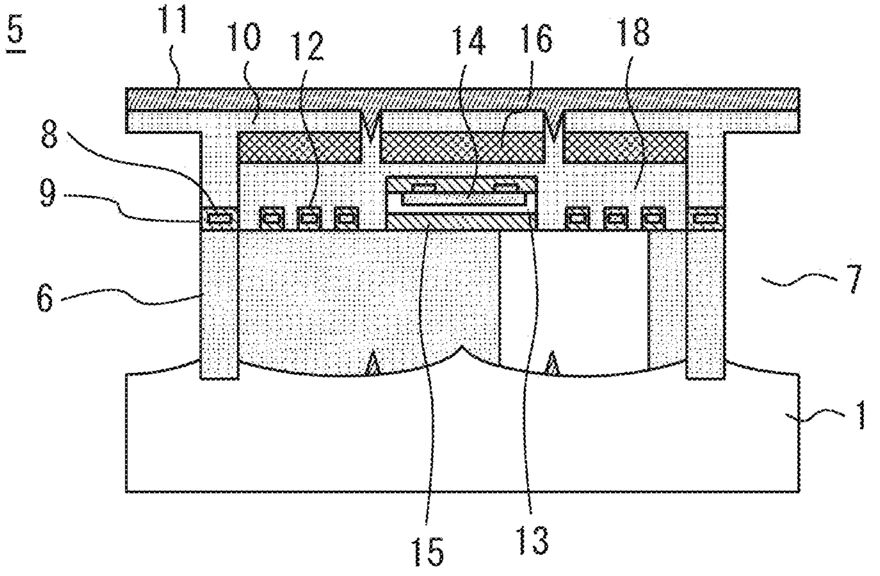
FIG. 28 is a cross-sectional view illustrating a getter part of a semiconductor sensor according to a fifth embodiment.

FIG. 28 is a cross-sectional view illustrating a getter part of a semiconductor sensor according to a fifth embodiment. In the present embodiment, not only in the detection part 4 but also in the getter part 5, the detection device 14 is formed in the hollow substrate 13 which is retained to be hollow by the support leg 12. In the getter part 5, the getter 16 is applied onto an inner side of the sealing material support body 10 above the detection device 14, that is, an upper portion on an inner side of the hollow structure body 3. Note that formation of the detection device 14 in the getter part 5 is not necessarily required, and a configuration is possible in which no detection device 14 is provided in the getter part 5.

Figure 29:
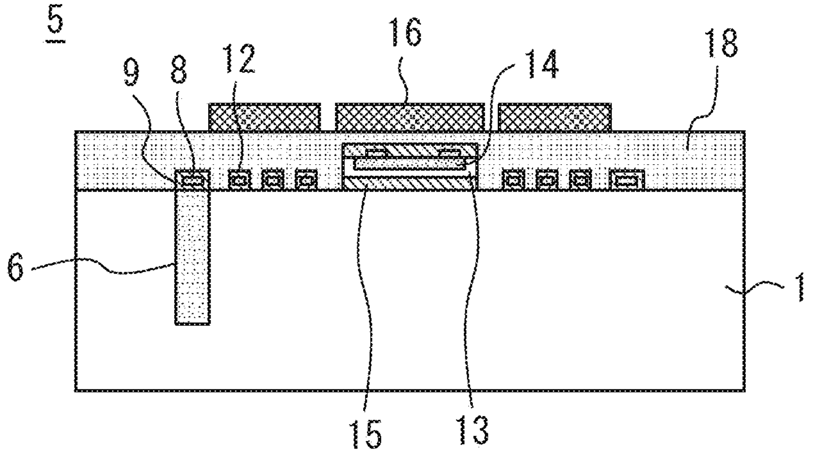
FIG. 29 is a cross-sectional view illustrating a method for manufacturing the semiconductor sensor according to the fifth embodiment.
Figure 30:
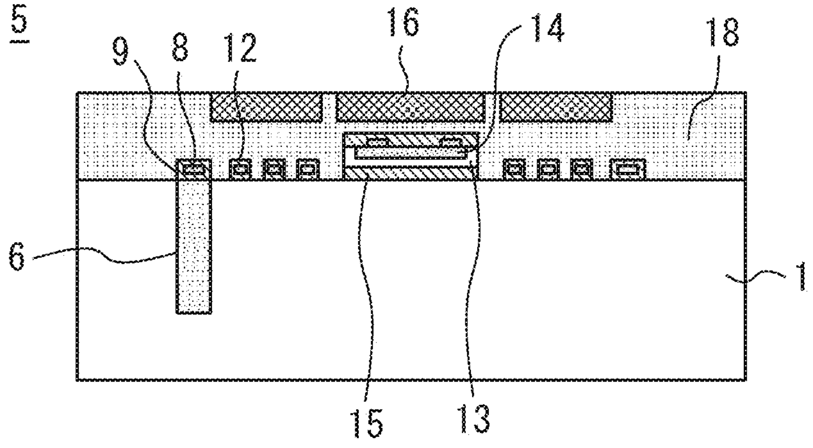
FIG. 30 is a cross-sectional view illustrating a method for manufacturing the semiconductor sensor according to the fifth embodiment.

FIG. 29 and FIG. 30 are cross-sectional views illustrating a method for manufacturing the semiconductor sensor according to the fifth embodiment. In the detection part 4 and the getter part 5, similarly to FIG. 11 of the first embodiment, the detection device 14, the hollow substrate 13, the wiring 8, and the support leg 12 are formed, and the sacrificial layer 18 is thereafter formed. In this case, a thickness of the sacrificial layer 18 to be applied is set thin taking into consideration the thickness of the getter 16 to be applied to the getter part 5. As a guide, the thickness is set to such a thickness that surfaces of the hollow substrate 13, the support leg 12, and the wiring 8 are covered by the sacrificial layer 18 and a surface of the sacrificial layer 18 is not uneven but is flat.

Next, nothing is applied in the detection part 4. On the other hand, as illustrated in FIG. 29, in the getter part, the getter 16 is applied onto the sacrificial layer 18 except a portion above the wiring 8 and portions in which the etching holes 20 are subsequently formed.

Next, as illustrated in FIG. 30, the sacrificial layer 18 is further applied onto the sacrificial layer 18 so as not to cover the getter 16. A subsequent manufacturing process is similar to that of the first embodiment. Because the sealing material support body is formed on the getter 16, after the sacrificial layer 18 is removed, the getter 16 is formed on the inner side of the sealing material support body 10.

In the present embodiment, the getter 16 can be applied onto an inner surface of the hollow structure body 3 in portions other than the etching holes 20 and the wiring 8. Consequently, because an applying area of the getter 16 in the getter part 5 can be increased, vacuum maintaining performance is improved.

Similarly to the fourth embodiment, in the getter part 5, a portion above the detection device 14 is covered by the getter 16 formed of the metal. For example, the metal having a somewhat thick film thickness is applied in order to enhance reflectance, and incidence of light on the detection device 14 of the getter part 5 can thereby be prevented. In a case where the detection device 14 serves as an infrared sensor, the detection device 14 covered by the getter 16 cannot detect infrared rays. Thus, the getter part 5 can be utilized as a reference pixel for obtaining a signal of the detection device 14 which is not receiving infrared rays. However, it is not necessary to use all of the getter parts 5 as the reference pixels, but the getter parts 5 other than a necessary number of those may have the configuration of the first embodiment.

Sixth Embodiment

Figure 31:
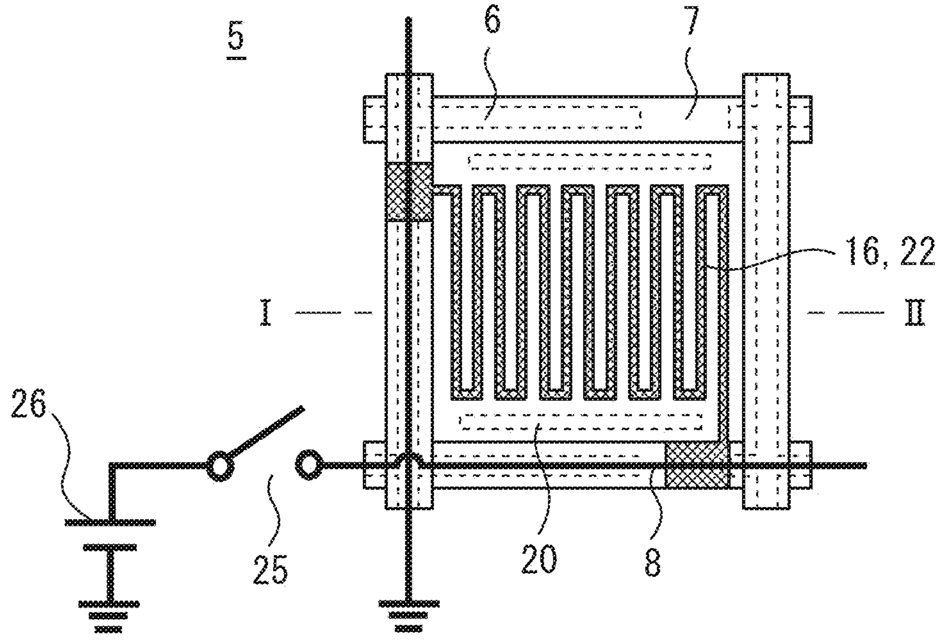
FIG. 31 represents a plan view and a circuit diagram which illustrate a getter part of a semiconductor sensor according to a sixth embodiment.
Figure 32:
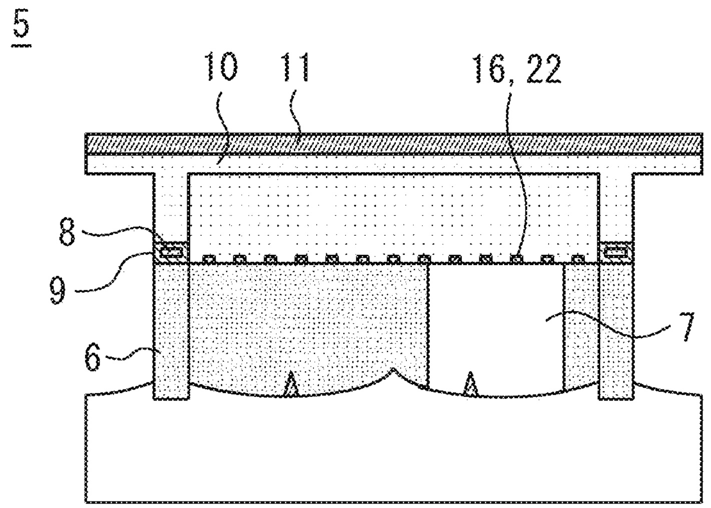
FIG. 32 is a cross-sectional view taken along line I-II in FIG. 31.

FIG. 31 represents a plan view and a circuit diagram which illustrate a getter part of a semiconductor sensor according to a sixth embodiment. FIG. 32 is a cross-sectional view taken along line I-II in FIG. 31. The getter 16 serves as thin hollow wiring 22 formed of metal such as Ti. The hollow wiring 22 is connected with a power source circuit, which includes a selection circuit 25 such as a switching circuit and a power source 26, via the wiring 8 and can selectively be electrically heated. The hollow wiring 22 functions as the getter 16 although not being electrically heated but can be activated as the getter 16 by being electrically heated. Consequently, when the vacuum state is degraded after the vacuum sealing, the vacuum degree can be improved by electrical heating. Other configurations are similar to those of the first embodiment, the vacuum degrees different among the hollow structure bodies 3 can respectively be adjusted to constant vacuum degrees.

Further, as the second and third embodiments, in a case where the plural hollow structure groups are provided, the vacuum degrees different among the hollow structure bodies can respectively be adjusted to constant vacuum degrees. Further, in a case where the fourth and fifth embodiments are combined together, the getter part 5 of the present embodiment is included in the same hollow structure group as the getter part 5 serving as the reference pixel, it thereby becomes possible to adjust the vacuum degree, and a stable output of the reference pixel can be obtained.

Because no hollow substrate 13 is provided to the getter part 5, the hollow wiring 22 which is thinly formed of Ti is formed on the semiconductor substrate 1 in the manufacturing process in FIG. 10 and is connected with the wiring 8. In this case, the hollow wiring 22 is made as long as possible. Accordingly, a resistance is made high, Ti is vaporized by a low current, and the vaporized Ti can thereby be activated as the getter 16. Other manufacturing processes are similar to those of the first embodiment. However, in a case where an interval in the hollow wiring 22 is narrow, a position of the etching hole 20 may be set to a portion between the hollow wiring 22 and the wiring 8. Here, the etching hole 20 is linearly provided between the hollow wiring 22 and the wiring 8.

Seventh Embodiment

Figure 33:
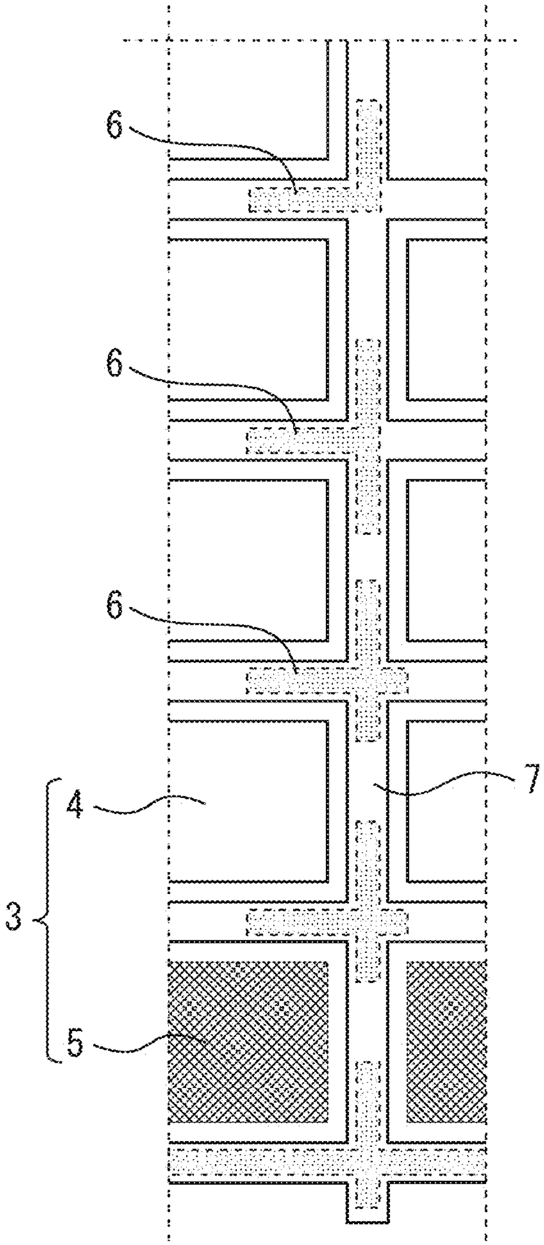
FIG. 33 is a plan view illustrating a semiconductor sensor according to a seventh embodiment.

FIG. 33 is a plan view illustrating a semiconductor sensor according to a seventh embodiment. The tunnel portion 7 is formed by hollowing out the support body 6 in a part of one side of the hollow structure body 3, which has a rectangular shape in a planar view, and is arranged to be adjacent to a corner of the hollow structure body 3 in a planar view. Other configurations are similar to those of the first embodiment.

Similarly to the first embodiment, the support body 6 is formed by filling the groove 17 with an oxide, but a corner of the support body 6 might insufficiently be filled with the oxide. In the present embodiment, because a planar shape of the support body 6 are formed to be not a cross-shaped support but an L shape or a T shape, uniform support bodies 6 can be formed. Further, because the corner of the support body 6 is filled up and a surface area of the support body 6 which adsorbs residual gas is decreased, a retaining capability for the vacuum degree can be enhanced.

Further, because strength of the support body 6 becomes low when the tunnel portion 7 is formed in one whole side of the hollow structure body 3, the tunnel portions 7 cannot be formed in four sides of the hollow structure body 3. In a case where the tunnel portion 7 is formed in only a part of one side of the hollow structure body 3, the tunnel portions 7 can be formed in the four sides of the hollow structure body 3.

Eighth Embodiment

Figure 34:
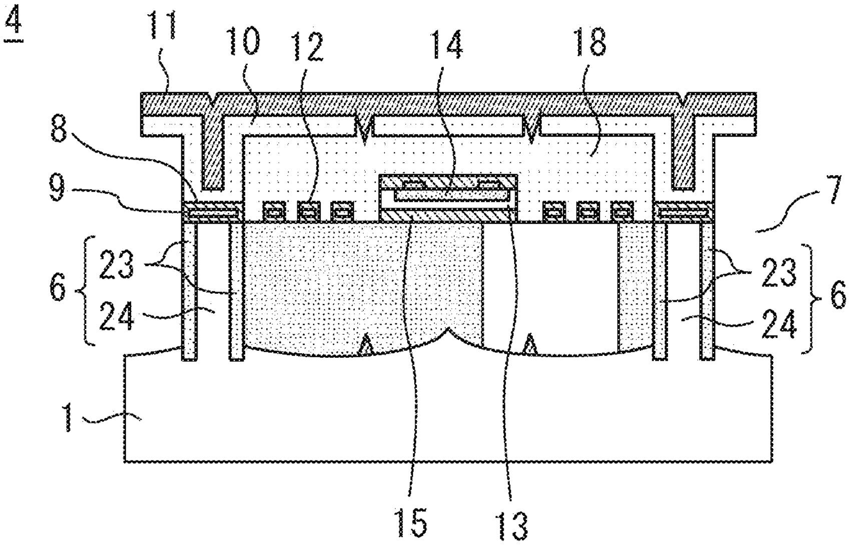
FIG. 34 is a cross-sectional view illustrating a semiconductor sensor according to an eighth embodiment.
Figure 35:
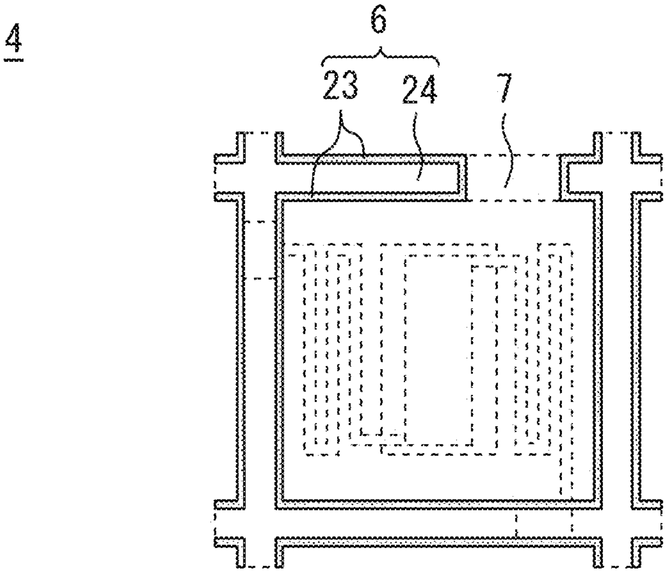
FIG. 35 is a plan view illustrating the semiconductor sensor according to the eighth embodiment.

FIG. 34 is a cross-sectional view illustrating a semiconductor sensor according to an eighth embodiment. FIG. 35 is a plan view illustrating the semiconductor sensor according to the eighth embodiment. In the present embodiment, the support body 6 has a semiconductor 24 as a part of the semiconductor substrate 1 and an oxide 23 provided to surround the semiconductor 24 along an outer periphery of the support body 6. Because a lateral width of the support body 6 becomes wider than that of the first embodiment, broad wiring 8 can be formed on the support body 6.

Figure 36:
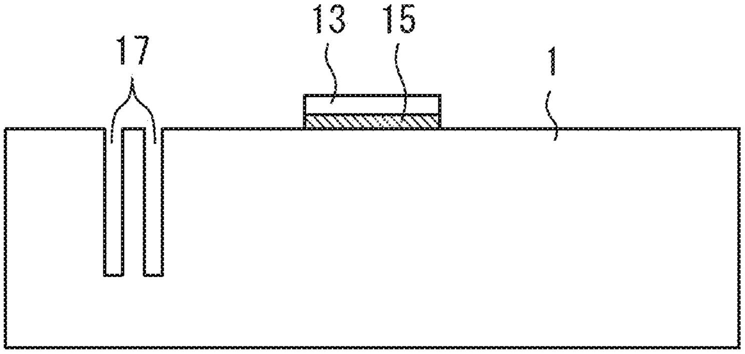
FIG. 36 is a cross-sectional view illustrating a method for manufacturing the semiconductor sensor according to the eighth embodiment.
Figure 37:
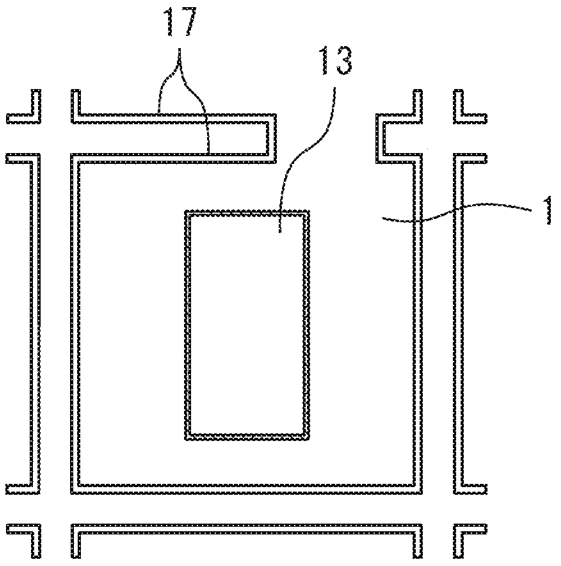
FIG. 37 is a plan view illustrating the method for manufacturing the semiconductor sensor according to the eighth embodiment.

FIG. 36 is a cross-sectional view illustrating a method for manufacturing the semiconductor sensor according to the eighth embodiment. FIG. 37 is a plan view illustrating the method for manufacturing the semiconductor sensor according to the eighth embodiment. Two grooves 17 are side by side formed to be adjacent to each other. In this case, the grooves 17 are formed to join together in a position where the tunnel portion 7 is formed. Next, the support body 6 is formed by filling the groove 17 with an oxide, and the wiring 8 is formed on an upper portion of the support body 6. A manufacturing process subsequent to this is similar to that of the first embodiment. Even in the tunnel portion 7, a surface of the support body 6 is covered by the oxide 23. Thus, for example, when the semiconductor substrate 1 is etched by xenon fluoride, the semiconductor 24 configuring the support body 6 remains while being not etched.

In a case of a large-sized sensor with a large array scale, the wiring 8 has to be made broad in order to decrease a wiring resistance. However, when the groove 17 is formed to be broad in accordance with broadness of the wiring 8 in the first embodiment, it is difficult to uniformly fill the groove 17 with the oxide, and it becomes difficult to form the support body 6. On the other hand, as in the present embodiment, it is easier to form the support body 6 by arranging two grooves 17 side by side.

Ninth Embodiment

Figure 38:
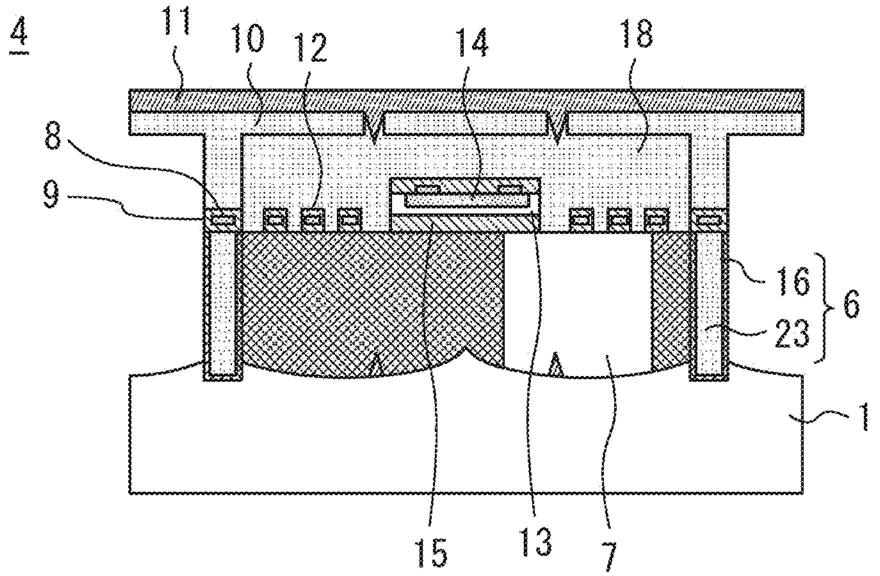
FIG. 38 is a cross-sectional view illustrating a semiconductor sensor according to a ninth embodiment.
Figure 39:
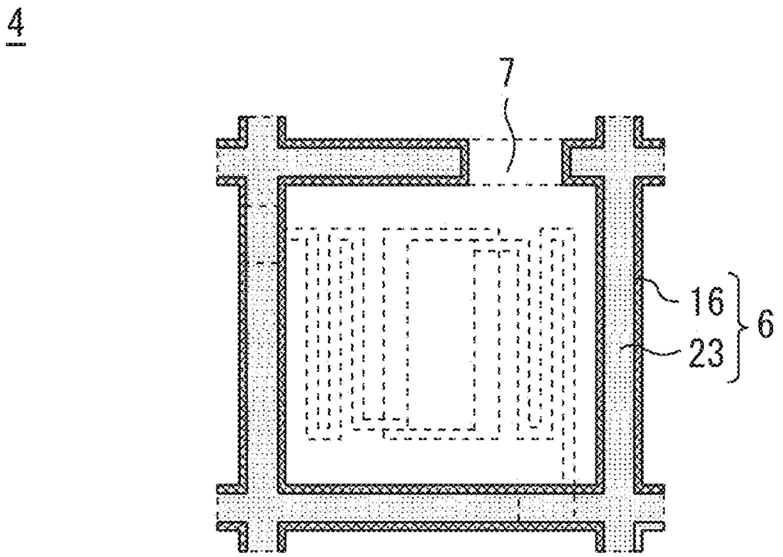
FIG. 39 is a plan view illustrating the semiconductor sensor according to the ninth embodiment.

FIG. 38 is a cross-sectional view illustrating a semiconductor sensor according to a ninth embodiment. FIG. 39 is a plan view illustrating the semiconductor sensor according to the ninth embodiment. In the present embodiment, the surface of the support body 6 is covered by the getter 16. Accordingly, the getter 16 can be included in the hollow structure body 3 of the detection part 4. Thus, the getter part 5 and the tunnel portion 7 may not be provided.

Figure 40:
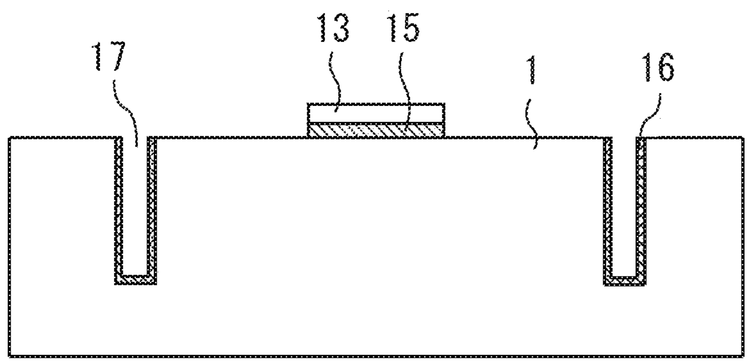
FIG. 40 is a cross-sectional view illustrating a method for manufacturing the semiconductor sensor according to the ninth embodiment.

FIG. 40 is a cross-sectional view illustrating a method for manufacturing the semiconductor sensor according to the ninth embodiment. The oxide film 15 is formed on the main surface of the semiconductor substrate 1, and the hollow substrate 13 is formed on the oxide film 15. The groove 17 is formed in the main surface of the semiconductor substrate 1 by etching. A film of the getter 16 is formed on an inner wall of the groove 17 by a method such as sputtering, the groove 17 is thereafter filled with the oxide 23, and the support body 6 is thereby formed. A subsequent manufacturing process is similar to that of the first embodiment. However, because the getter 16 as a metal material is present on the surface of the support body 6, only the semiconductor substrate 1 as a semiconductor such as Si is isotropically etched while the support body 6 is not etched. Consequently, the hollow structure body 3 is formed by selectively etching the semiconductor substrate 1 with respect to the getter 16.

Because the getter 16 is provided on the surface of the support body 6, a sufficient getter area for retaining a proper vacuum degree can be secured. Further, because the getter part is not necessary, a pixel array region can be reduced.

Figure 41:
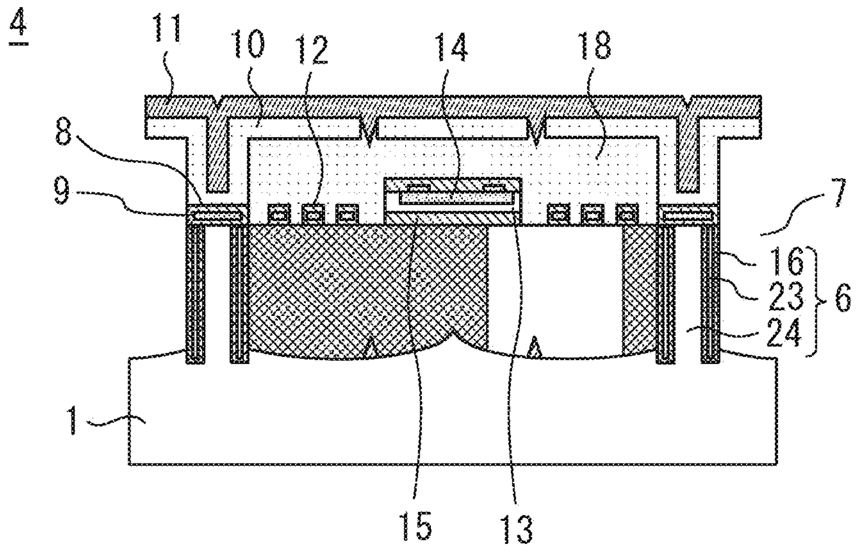
FIG. 41 is a cross-sectional view illustrating a modification of the semiconductor sensor according to the ninth embodiment.
Figure 42:
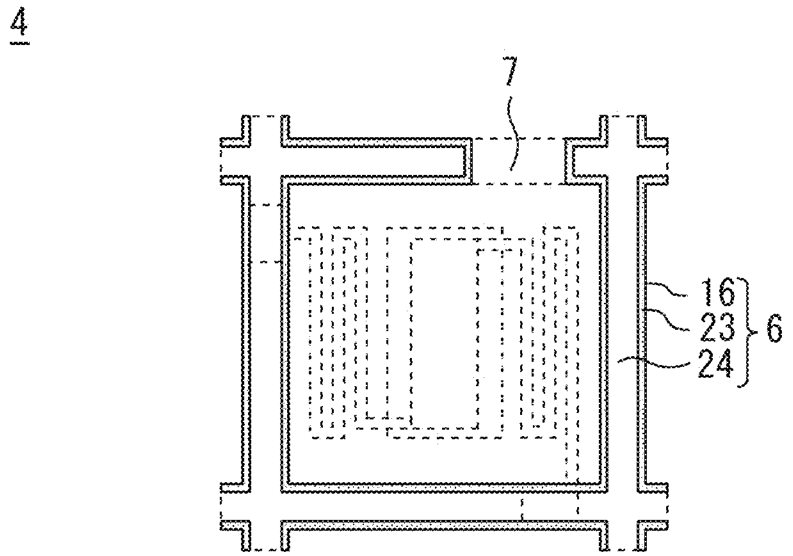
FIG. 42 is a plan view illustrating the modification of the semiconductor sensor according to the ninth embodiment.

FIG. 41 is a cross-sectional view illustrating a modification of the semiconductor sensor according to the ninth embodiment. FIG. 42 is a plan view illustrating the modification of the semiconductor sensor according to the ninth embodiment. Also in a case where the support body 6 is formed by arranging two grooves 17 side by side as in the eighth embodiment, similar effects can be obtained by covering the surface of the support body 6 by the getter 16.

REFERENCE SIGNS LIST

1 semiconductor substrate; 3 hollow structure body; 4 detection part; 5 getter part; 6 support body; 7 tunnel portion; 8 wiring; 9 insulating layer; 10 scaling material support body; 11 sealing material; 12 support leg; 13 hollow substrate; 14 detection device; 15 oxide film; 16 getter; 17 groove; 18 sacrificial layer; 19 opening; 20 etching hole; 21 hollow structure group; 22 hollow wiring; 23 oxide; 24 semiconductor; 25 selection circuit; 26 power source

The invention claimed is:

1. A semiconductor sensor comprising:

a single semiconductor substrate;

plural hollow structure bodies formed in the semiconductor substrate in an array manner and having a detection part as a hollow structure and a getter part as a hollow structure different from the detection part;

a support body demarcating the plural hollow structure bodies;

a sealing material support body laminated on the support body; and a sealing material provided on the sealing material support body and vacuum-sealing the plural hollow structure bodies, wherein the detection part has a detection device inside, the getter part has a getter inside, the detection part and the getter part are spatially joined together by a tunnel portion formed in the support body to constitute a hollow structure group sharing a vacuum space, the tunnel portion being a portion obtained by cavitating a part of the support body, and the detection part and the getter part of the hollow structure group are sealed per the hollow structure in a vacuum space closed and separated by the sealing material and the support body respectively.

2. The semiconductor sensor according to claim 1, comprising:

wiring formed on the support body; and a support leg retaining the detection device to be hollow in the detection part and connecting the wiring with the detection device.

3. The semiconductor sensor according to claim 1, comprising:

the plural hollow structure bodies are separated into plural hollow structure groups which are not spatially joined with each other, and each of the hollow structure groups has at least one detection part and at least one getter part.

4. The semiconductor sensor according to claim 3, wherein the detection part and the getter part are arranged in one of longitudinally or laterally aligned columns, are spatially joined together via the tunnel portion and share a vacuum space in at least one of the columns in each of the hollow structure groups.

5. The semiconductor sensor according to claim 3, wherein the detection part and the getter part are arranged longitudinally and laterally, spatially joined together via the tunnel portion in each section formed with two or more rows and two or more columns and share a vacuum space in each of the hollow structure groups.

6. The semiconductor sensor according to claim 2, wherein the getter is applied onto a hollow substrate retained to be hollow by the support leg.

7. The semiconductor sensor according to claim 2, wherein the detection device is formed in a hollow substrate retained to be hollow by the support leg in the detection part and the getter part, and the getter is applied onto the hollow substrate in which the detection device is formed in the getter part.

8. The semiconductor sensor according to claim 1, wherein the getter is applied onto an upper portion on an inner side of the sealing material support body in the getter part.

9. The semiconductor sensor according to claim 1, wherein the getter has hollow wiring formed of metal, and the hollow wiring is electrically heatable.

10. The semiconductor sensor according to claim 1, wherein the tunnel portion is formed by hollowing out the support body in a part of one side of the hollow structure body having a rectangular shape in a planar view and is arranged to be spaced away from a corner of the hollow structure body.

11. The semiconductor sensor according to claim 1, wherein the tunnel portion is formed by hollowing out the support body in a part of one side of the hollow structure body having a rectangular shape in a planar view and is arranged to be adjacent to a corner of the hollow structure body.

12. The semiconductor sensor according to claim 1, wherein the support body has a semiconductor as a part of the semiconductor substrate and an oxide provided to surround the semiconductor along an outer periphery of the support body.

13. The semiconductor sensor according to claim 1, wherein the detection device is a thermal infrared detection device.

14. The semiconductor sensor according to claim 1, wherein the support body demarcates each of the plural hollow structure bodies from adjacent ones of the plural hollow structure bodies except where the tunnel portion is formed in the support body, and the tunnel portion provides fluid communication between the detection part and the getter part of the hollow structure group such that the detection part and the getter part share the vacuum space.

15. The semiconductor sensor according to claim 2, wherein the support leg electrically connects the wiring with the detection device.

16. The semiconductor sensor according to claim 2, wherein the detection device of the detection part is retained to be hollow by the support leg and is spaced away from the sealing material support body and the semiconductor substrate.

17. The semiconductor sensor according to claim 6, wherein the getter part is free of any detection device.

18. The semiconductor sensor according to claim 2, wherein the wiring extends along the support body in a longitudinal direction and a lateral direction between the plural hollow structure bodies.

19. The semiconductor sensor according to claim 7, wherein the getter applied onto the hollow substrate in the getter part covers the detection device formed in the hollow substrate in the getter part such that incidence of light on the detection device of the getter part is prevented.

* * * * *